United States Patent [19]

Cutchaw

[11] 4,293,175

[45] Oct. 6, 1981

[54] CONNECTOR FOR INTEGRATED CIRCUIT PACKAGES

[76] Inventor: John M. Cutchaw, Scottsdale, Ariz.

[21] Appl. No.: 64,057

[22] Filed: Aug. 6, 1979

Related U.S. Application Data

[63] Continuation-in-part of Ser. No. 913,871, Jun. 8, 1978, Pat. No. 4,166,665, which is a continuation-in-part of Ser. No. 862,582, Dec. 20, 1977, Pat. No. 4,164,003, which is a continuation-in-part of Ser. No. 754,368, Dec. 27, 1976, Pat. No. 4,063,791.

[51] Int. Cl.³ .......................................... H01R 13/62
[52] U.S. Cl. ........................ 339/75 MP; 339/17 CF
[58] Field of Search ............ 339/17 CF, 75 MP, 112, 339/125

[56] References Cited

U.S. PATENT DOCUMENTS 3,877,064 4/1975 Scheingold et al. ........ 339/17 CF X
4,166,665 9/1979 Cutchaw ......................... 339/112 L

FOREIGN PATENT DOCUMENTS

1203188 8/1970 United Kingdom ............ 339/125 L

Primary Examiner—Joseph H. McGlynn
Assistant Examiner—Frank H. McKenzie, Jr.
Attorney, Agent, or Firm—Herbert E. Haynes, Jr.

[57] ABSTRACT

A connector for demountably attaching an integrated circuit package to a backpanel and forming an electrically conductive pressure coupling between the contacts of the integrated circuit package and the terminal pads of the backpanel. In the preferred embodiment, the connector includes a carrier member upon which the integrated circuit package is mounted and the carrier member has at least one boss extending normally therefrom into a hole formed through the backpanel. The boss of the carrier member has a headed stud extending coaxially therefrom so as to protrude through the hole in the backpanel. A mounting plate is located in contiguous engagement with the opposite surface of the backpanel with the headed stud of the carrier member extending into a special aperture formed through the mounting plate. Sliding movement of the mounting plate causes an interaction between the stud and the special aperture to pull the carrier member into bearing engagement with the backpanel and electrically couple the contacts of the integrated circuit package to the terminal pads of the backpanel.

23 Claims, 17 Drawing Figures

FIG_6

_FIG-7_

_FIG-8_

_FIG-9_

_FIG-10_

_FIG-11_

CONNECTOR FOR INTEGRATED CIRCUIT PACKAGES

Cross-Reference to Related Applications

This application is a continuation-in-part of a copending U.S. patent application Ser. No. 913,871, filed June 8, 1978 and now U.S. Pat. No. 4,166,665 for: "Liquid Cooled Connector for Large Scale Integrated Circuit Packages", which is in turn a continuation-in-part of a copending U.S. patent application Ser. No. 862,582, filed Dec. 20, 1977 and now U.S. Pat. No. 4,164,003 for: "Improved Connector for Leadless Integrated Circuit Packages" which is in turn a continuation-in-part of Ser. No. 754,368, filed Dec. 27, 1976 now U.S. Pat. No. 4,063,791 issued Dec. 20, 1977, all by the same inventor.

BACKGROUND OF THE INVENTION

1. Field of the Invention

This invention relates to electrical connectors and more particularly to an electrical connector for coupling an integrated circuit package to a backpanel.

2. Description of the Prior Art

The need for an improved integrated circuit interconnection technique has become critical from performance and profit standpoints, with companies who are trying to use the highly developed microelectronic integrated circuit technology in commercial and consumer applications such as computers, automotive, appliances, communications, industrial components, industrial systems and the like.

This problem stems from the increased packaging densities of the microelectronic integrated circuit packages which require more electrical contacts to couple input-output signals to the integrated circuit chips within the packages. The connectors for physcially mounting the integrated circuited packages and electrically interconnecting them into the system in which they are to be used oftentimes are larger and occupy more valuable space than the packages themselves.

Integrated circuit packages of the well known daul-in-line package type (DIP), is a rectangular body with leads extending from opposite longitudinal edges thereof, and such structures have several problems and shortcomings with regard to their extending leads and limitations of contact spacing. The leads of the DIP are not strong enough for the manual and mechanical handling which they are receiving as they are being employed in the various applications. Further, since the leads of the DIP are located only on two opposite side edges of the package, the contact spacing is seriously limited. The lead strength problem of the DIP has led to the development of what is referred to as a leadless dual-in-line package, in which terminal pads are provided in place of the extending leads. While this solved the lead strength problem, it did not solve the problem of the lack of contact space.

To solve the problem of contact space, an integrated circuit package of square configuration with contacts on all four side edges thereof was developed. These packages, which are sometimes referred to as JEDEC large scale integrated circuit packages, are usually multichip carriers having common contact patterns on all edges thereof, and are fabricated as both leaded and leadless structures.

Commercial acceptance of these new packages, i.e., DIP leadless and JEDEC leaded and leadless, has been relatively slow for several reasons, with a particular problem stemming from the connectors for mounting and electrically interconnecting packages with a backpanel such as a printed circuit board or wiring panel.

Various connector configurations have been employed or suggested for the various integrated circuit packages, with these prior art connectors being relatively costly, bulky, and multipart complex structures. Since the use of terminal pads in the leadless structures dictates that a pressure type of interconnection be employed, the forces needed to achieve reliable connections becomes quite large and can be a serious problem when relatively large numbers of such interconnections are to be made.

One particular prior art connector employs a base which is mounted on the backpanel by soldering or otherwise attaching the wire wrap pins, which depend from the base, into the backpanel. The leadless package is mounted within a recess provided in the base and the terminal pads of the package are pressurized into conductive contact with upwardly extending portions of the wire wrap pins. The necessary downward pressure is accomplished by means of a cover hingedly mounted on the base. This, and similar prior art connectors, are usually employed only on relatively small leadless packages of the type having terminal pads on only two edges thereof due to the inability of such covers to achieve equal pressurization over long spans and on packages having terminal pads on more than two edges.

Another type of prior art connector employs a base, similar to the one described above, for receiving the leadless package. A force exerting element is placed on the leadless package and is pressurized downwardly by means of a cover which is screwed in place. The screws are located only at the corners or ends of such connectors, as determined by the geometric configuration, so as not to sacrifice valuable contact space. Such a mounting technique complicates the servicing and when relatively large leadless packages are mounted in this type of connector, uneven contact pressurization can result in the spans between the mounting screws due to deflection or bowing of the cover and the force exerting element.

A particular prior art connector, which is fully disclosed in U.S. Pat. No. 3,904,262, issued on Sept. 9, 1975, to the sme inventor, includes a base receptacle mounted on a backpanel and having contact means therein which are in contact with the backpanel. The receptacle is adapted to receive the circuit package therein so that the terminal pads thereof are in alignment with the contact means provided in the receptacle. A cover is removably mounted in the receptacle and is laterally slidable relative thereto into and out of engagement with inclined plane members formed in the receptacle. When the cover is moved into engagement with the inclined plane members, it will be deflected down and locked in place to load the terminal pads of the circuit package into conductive contact with the contact means of the base receptacle. This connector, while constituting a substantial improvement in the art has some drawbacks in that the wedging action provided by engagement of the cover with the inclined plane members is exerted only on three sides of the circuit package thus making it possible for unequal pressurization of the terminal pads on the fourth side of the circuit package to occur. Further, this prior art connector requires the use of tooling to accomplish the required lateral sliding of the cover thereof.

In view of the foregoing, a need exists for a new and improved connector for integrated circuit packages which overcomes some of the problems and shortcomings of the prior art.

SUMMARY OF THE INVENTION

In accordance with the present invention, new and improved connectors for mounting and electrically interconnecting integrated circuit packages with a backpanel are disclosed.

In a preferred embodiment, the connector of the present invention includes a carrier member for placement adjacent one of the surfaces of the backpanel, with the carrier member having at least one integrated circuit package mounted thereon, and having bosses which extend normally therefrom into holes formed through the backpanel to which the integrated circuit package is to be mounted and electrically connected. The bosses of the carrier member have headed studs extending coaxially therefrom so as to protrude through the holes of the backpanel. A mounting plate is located in contiguous engagement with the opposite surface of the backpanel with the headed studs of the carrier member extending into aligned special apertures formed through the mounting plate. Sliding movement of the mounting plate relative to the backpanel causes an interaction between the headed studs and the apertures to pull the carrier member toward the backpanel to exert a pressurizing force which electrically couples the contacts of the integrated circuit package to the terminal pads of the backpanel.

In a first configuration of this preferred embodiment of the connector of the present invention, the carrier member is adapted to carry either DIP leadless packages or the hereinbefore described JEDEC packages of either the leaded or leadless type, and electrically couple the contacts of those packages to the terminal pads of the backpanel. In a second version of the preferred embodiment of the connector of the present invention, the carrier member is configured to carry a leaded DIP package and pressurize its leads into conductive contact with the terminal pads of the backpanel.

In a second embodiment of the connector of the present invention, the function of the above described carrier member is accomplished by the circuit package itself. A JEDEC integrated circuit package of the leaded type is provided with bosses extending normally therefrom through the holes in the backpanel, and those bosses have the coaxial headed studs extending therefrom. The mounting plate with the special apertures is employed as described above to directly pull the JEDEC integrated circuit package into conductive contact with the backpanel. In this same second embodiment, the JEDEC integrated circuit package may be affixed, such as with a suitable adhesive, to the internal cavity of a cover which serves as a liquid cooling device to draw off and dissipate the heat generated by operation of the circuit package. The cooling cover forms a liquidtight chamber around the circuit package, and a coolant is supplied to an extracted from the cover to cool the integrated circuit package.

The interaction with the headed studs of the carrier member, or of the circuit package itself, with the special apertures of the mounting plate, exerts a compression force on the backpanel, and this force may be employed to fabricate a special multilayer backpanel. The special multilayer backpanel includes alternating layers of rigid material having conductive runs and transverse metal paths or vias thereon, and elastomeric material having similar metallic conductive runs and transverse paths or vias. The alternating layers of rigid and elastomeric material are pressurized into conductive contact with each other by means of the compressive forces exerted by the connectors of the present invention.

Accordingly, it is an object of the present invention to provide new and useful connectors for mounting and electrically connecting integrated circuit packages to a backpanel.

Another object of the present invention is to provide a new and useful connector for mounting and electrically coupling a large scale integrated circuit package of the type sometimes referred to as a JEDEC package, to a backpanel.

Another object of the present invention is to provide a new and useful connector for mounting and electrically coupling a dual-in-line package of the leaded or leadless type to a backpanel.

Another object of the present invention is provide a new and useful connector for mounting and electrically coupling an integrated circuit package to a backpanel, with the connector including a carrier member for positioning adjacent one surface of the backpanel, and having at least one circuit package mounted thereon and having bosses which extend therefrom into holes formed through the backpanel. The bosses have headed studs which interact with special apertures formed through a slidably movable mounting plate, which is positioned on the opposite side of the backpanel, to pull the carrier member and circuit package toward the backpanel and pressurize the contacts of the integrated circuit package into conductive contact with the terminal pads of the backpanel.

Another object of the present invention is to provide a new and improved connector for mounting and electrically coupling an integrated circuit package to a backpanel with the circuit package having bosses extending therefrom into holes formed through the backpanel. The bosses have headed studs which interact with special apertures formed through a slidably movable mounting plate that is positioned on the opposite surface of the backpanel to pull the integrated circuit package toward the backpanel and pressurize the contacts thereof into conductive contact with the terminal pads of the backpanel.

Still another object of the present invention is to provide a new and improved connector of the above described type in which the integrated circuit package having extending bosses is affixed within the cavity of a cover through which a liquid coolant is circulated for cooling of the integrated circuit package.

Yet another object of the present invention is to provide new and improved connectors of the above described types which exert a compressive force on a multilayer backpanel that includes alternating layers of rigid material and elastomeric material all of which are provided with metallic conductive runs and metallic transverse vias.

The foregoing and other objects of the present invention, as well as the invention itself, may be more fully understood from the following description when read in conjunction with the accompanying drawings.

DESCRIPTION OF THE PREFERRED EMBODIMENTS

Figures 1, 2:
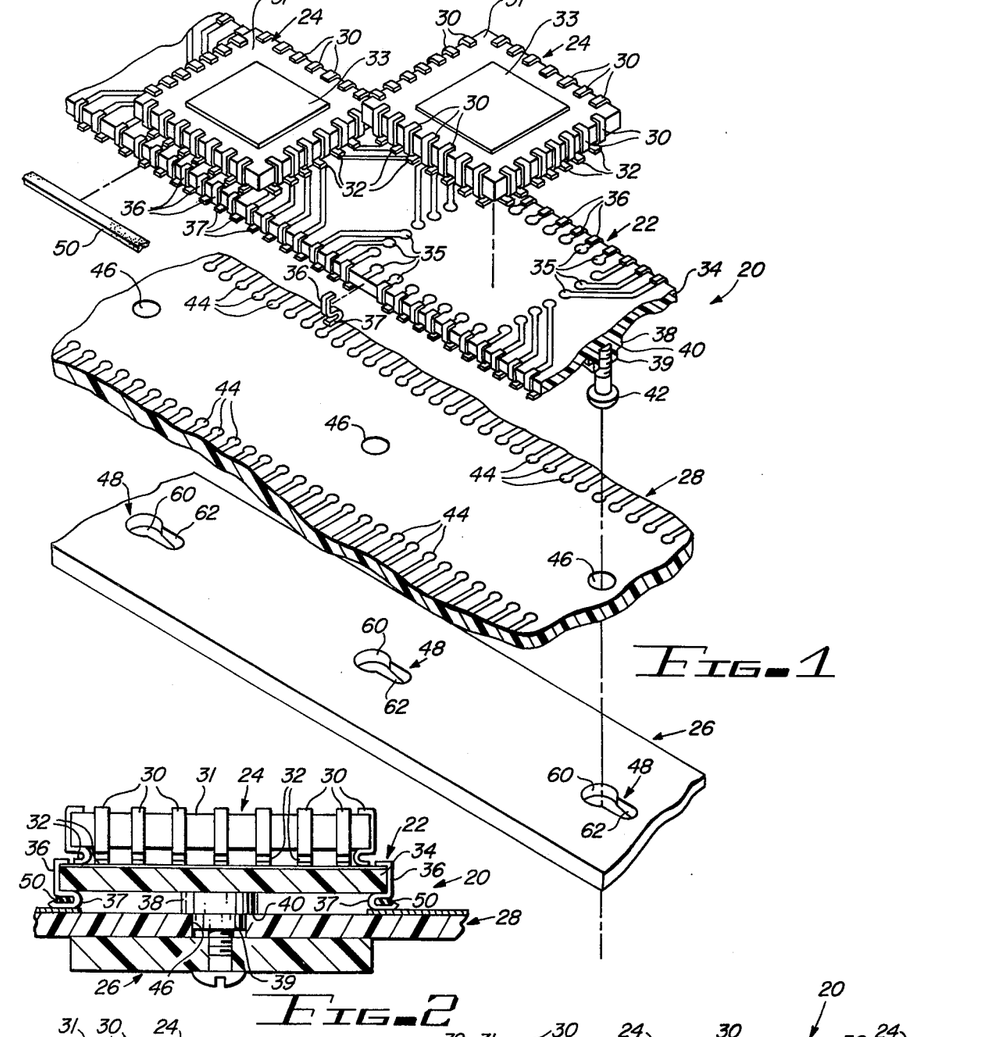
FIG. 1 is a fragmentary exploded isometric view of a first configuration of a preferred embodiment of the connector of the present invention and illustrating the various features thereof.
FIG. 2 is an enlarged fragmentary transverse sectional view of the connector shown in FIG. 1.
Figure 3:
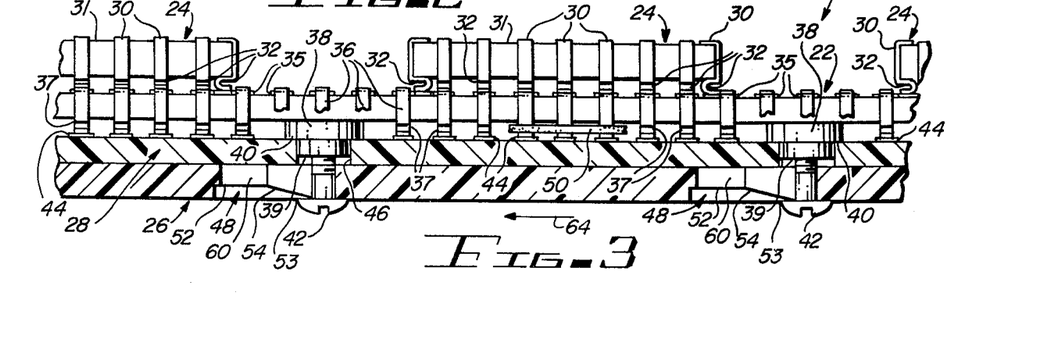
FIG. 3 is an enlarged fragmentary longitudinal sectional view of the connector shown in FIG. 1.

Referring more particularly to the drawings, FIGS. 1, 2 and 3 show the first form of the preferred embodiment of the connector of the present invention, with this connector being indicated generally by the reference numeral 20. As will hereinafter be described in detail, the connector 20 includes a carrier member 22, having a plurality of integrated circuit packages 24 mounted thereon, and a mounting plate 26 which cooperates with the carrier member 22 to mount and electrically couple the circuit packages 24 to a backpanel 28.

The integrated circuit package 24 is one of the package types sometimes referred to as a JEDEC large scale integrated circuit package. It is to be understood that JEDEC packages are of various configurations which are broadly divided into the leaded types and leadless types. In other words, a JEDEC package refers to a family of square packages having common connector patterns on each of the four peripheral edges thereof. The particular JEDEC package shown in FIGS. 1, 2 and 3 is illustrative of the several types within the JEDEC family, and was shown merely for illustrative purposes. The integrated circuit package 24 has a plurality of leads 30 in the form of spring contacts on each of the peripheral edges of a planar substrate 31. Each of the leads 30 wrap around their respective peripheral edges and have depending spring contact portions 32. Discrete integrated circuits (not shown) are mounted within the substrate 31 and are electrically interconnected with the leads 30 in a well known manner, and a cover 33 (FIG. 1) is provided for sealingly enclosing the discrete circuits which are known as chips.

The carrier member 22 of the connector 20 is a printed circuit board which includes an insulative substrate 34 having terminal pads 35 and their associated conductive runs plated or otherwise formed thereon. Carrier member 22 can be configured to carry a single integrated circuit package 24 in which case it would be of square configuration, or it may be an elongated structure as shown to carry a plurality of the packages.

In either case, the terminal pads 35 of the carrier member 22 are arranged in an array which matches the lead pattern of the circuit package 24. Thus, placement of the package on the carrier member, will provide each of the package leads 30 with an aligned terminal pad 35. The circuit package 24 is physically mounted in this position such as by soldering, which also forms electrical interconnection of the leads 30 with their respectively aligned terminal pads 35.

It will be apparent from the foregoing, that a leadless integrated circuit package (not shown) can be connected to the carrier member 22 in the same manner.

The conductive runs extending from each of the terminal pads 35 of the carrier member 22 extend from their respective pads to the edges of the carrier member where they are electrically coupled, such as by soldering, to edge contacts 36. Each of the edge contacts 36 wrap around the edge of the carrier member 22, are in conductive contact with a different one of the conductive runs, and each have a depending spring contact portion 37. The carrier member 22 has molded, or otherwise formed, bosses 38 depending normally therefrom with each boss having its extending end 39 of reduced diameter to provide a shoulder 40 thereon. A headed stud means 42 extends coaxially from each of the bosses 38, and the studs may be in the form of button head screws as shown. The bosses 38 may be formed in any desired location on the carrier member 22, such as between each of the adjacent integrated circuit packages 24 as seen best in FIG. 3.

The backpanel 28 is in the form of a printed circuit board of the well known commonly employed type, and has terminal pads 44 and their associated conductive runs plated or otherwise formed thereon. The terminal pads 44 are arranged on the backpanel 28 so as to correspond to the arrangement of the edge contacts 36 of the carrier member 22, and the backpanel is provided with holes 46 formed therethrough for receiving the bosses 38 of the carrier member 22.

The mounting plate 26 is a rigid structure of metal, plastic, or other suitable material, and is formed with special aperture means 48 which, as will hereinafter be described in detail, interact with the headed stud means 42 of the carrier member 22 for mounting and electrical coupling purposes.

With the leads 30 of the integrated circuit packages 24 fixedly coupled to the terminal pads 35 of the carrier member 22, and the bosses 38 and headed studs 42 of the carrier member 22 extending into the holes 46 of the backpanel 28, as seen best in FIGS. 2 and 3, each of the edge contacts 36 of the carrier member 22 will be in alignment with different ones of the terminal pads 44 of the backpanel 28. Electrical interconnection of the edge contacts 36 with the aligned terminal pads 44 is made by means of a pressure connection, and the necessary force required to achieve such a pressure connection is derived by the mounting plate 26 pulling the carrier member 22 toward the backpanel through the interaction of the stud means 42 of the carrier member with the special aperture means 48 of the mounting plate 26.

The pressure interconnection of the edge contacts 36 with the terminal pads 44 can result in contact problems in the absence of some means for maintaining alignment and supporting the extending spring contact portions 37. First, the edge contacts 36 are very small and rather delicate structures and are positioned on very small centers. Thus, any bending or other displacement of the spring contact portions can cause lead misalignment and/or lead shorting problems. Secondly, overpressurization, equipment vibrations and the like can cause lead displacement, metal fatigue and other problems which result in contact failure. Therefore, means for maintaining lead alignment and providing support therefor are provided in the form of a pair of elongated elastomeric strips 50 as seen best in FIGS. 2 and 3, each of the elastomeric strips 50 extend between all of the spring contact portions 37 which are aligningly disposed along different ones of the edges of the carrier member 22 and are fixedly interposed in the loops of each of the spring contact portions 37. The elastomeric strips 50 may be fixedly held in the spring contact portions 37 such as by means of a suitable adhesive (not shown), or may be captively held in the loops by means of the spring contact portions themselves being wrapped part way around the strips as shown in FIG. 3.

Each of the stud means 42 is provided with a shank portion having an enlarged head portion on the lower end thereof, with the studs suitably mounted in the bosses 38 of the carrier member 22. The upwardly facing flat surfaces of the enlarged heads of the studs act as shoulders for carrier member pulling and retaining purposes as will hereinafter be described in detail.

Figure 12:
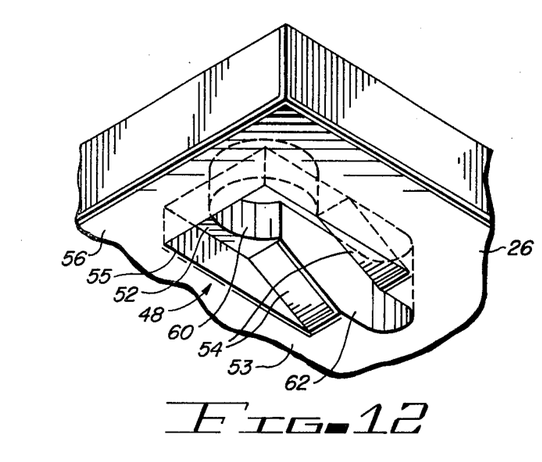
FIG. 12 is an enlarged fragmentary isometric view of a portion of the mounting plate of the connectors of the present invention illustrating a first embodiment of a typical one of the special apertures formed therein.
Figure 13:
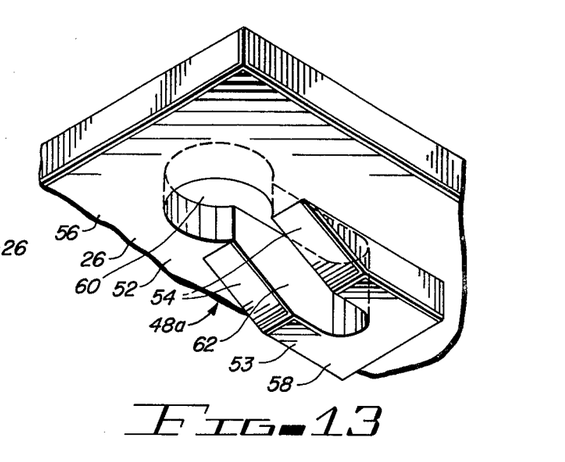
FIG. 13 is a view similar to FIG. 12 and showing a second embodiment of a typical one of the special apertures formed in the mounting plate of the connector of the present invention.

In the preferred form, each of the aperture means 48 includes a special surface configuration formed in the mounting plate 26. As best seen in FIG. 12, the preferred aperture means comprises an upper surface 52, a lower surface 53 which is laterally spaced from the upper surface, and an inclined plane surface 54, or ramp, which extends between the upper surface 52 and the lower surface 53. As seen, the upper surface 52 is provided by forming a cavity 55 which is recessed upwardly from the lower planar surface 56 of the mounting plate 26, and the lower surface 53 is actually a portion of the lower planar surface 56 of the mounting plate. Although that particular configuration is preferred, FIG. 13 illustrates another method of accomplishing the same objective. In the modified form shown in FIG. 13, the upper surface 52 of the aperture means 48a is actually a portion of the lower planar surface 56 of the mounting plate, and the lower surface 53 is provided by molding or otherwise forming a depending pedestal 58 on the mounting plate 56 with the lower surface 53 being the bottom of the depending pedestal 58, and the inclined plane surface 54 forming one side thereof.

In either case, each of the aperture means 48 and 48a further comprises a keyhole shaped aperture formed through the mounting plate 26 with the aperture including an enlarged portion 60 and a laterally extending narrowed slot 62. The enlarged portions 60 of the keyhole apertures open downwardly onto their respective upper surfaces 52 and are sized to be somewhat larger than the heads of the depending stud means 42 so that when the mounting plate 26 is placed in contiguous engagement with the bottom planar surface of the backpanel 28, the depending studs 42 will each enter into an aligned one of those enlarged portions 60. The narrowed slots 62 of the keyhole apertures each open downwardly onto the inclined plane surface 54 and onto the lower surface 53, and each have a width dimension which is somewhat larger than the diameter of the shanks of the stud means 42 to permit lateral sliding movement of the mounting plate 26 relative to the backpanel 28 and the carrier member 22 as will hereinafter be described in detail.

As seen best in FIG. 1, the narrowed slots 62 of each of the keyhole apertures all extend in the same direction. Thus, when the mounting plate 26 is placed in contiguous engagement with the bottom planar surface of the backpanel 28, the stud means 42 will enter into the aligned aperture means 48 passing downwardly in the enlarged portions 60 as hereinbefore mentioned, and will locate the enlarged heads of the studs 42 below the upper surfaces 52 of their respective aperture means. Lateral sliding movement of the mounting plate 26 in the direction of the arrow 64 (FIG. 3) will move the keyhole apertures relative to the studs so that the narrowed slots 62 are moved into straddling positions relative to the shanks of the studs 42. Such movement will bring the inclined plane surfaces 54 into wedged engagement with the upwardly facing shoulders of the studs, and thereby pull the carrier member 22 downwardly toward the backpanel 28. The downwardly directed force exerted by the mounting plate 26 will bring the spring contact portions 37 of the edge contacts 36 of the carrier member 22 into loaded pressurized conductive contact with the aligned terminal pads 44 of the backpanel 28. When the inclined plane surfaces 54 of the aperture means 48 have passed completely above the heads of the studs 42, the shoulders of the studs will bear against the lower surfaces 53 and therefore, the carrier member 22 will be lockingly held in the downwardly pulled direction.

It should be noted that the inclined plane surfaces 54 should be configured with a length to height ratio of at least 3 to 1, and preferably 5 to 1, to provide a mechanical advantage that is high enough to facilitate lateral sliding movement of the mounting plate 26.

Figures 14, 15, 16:
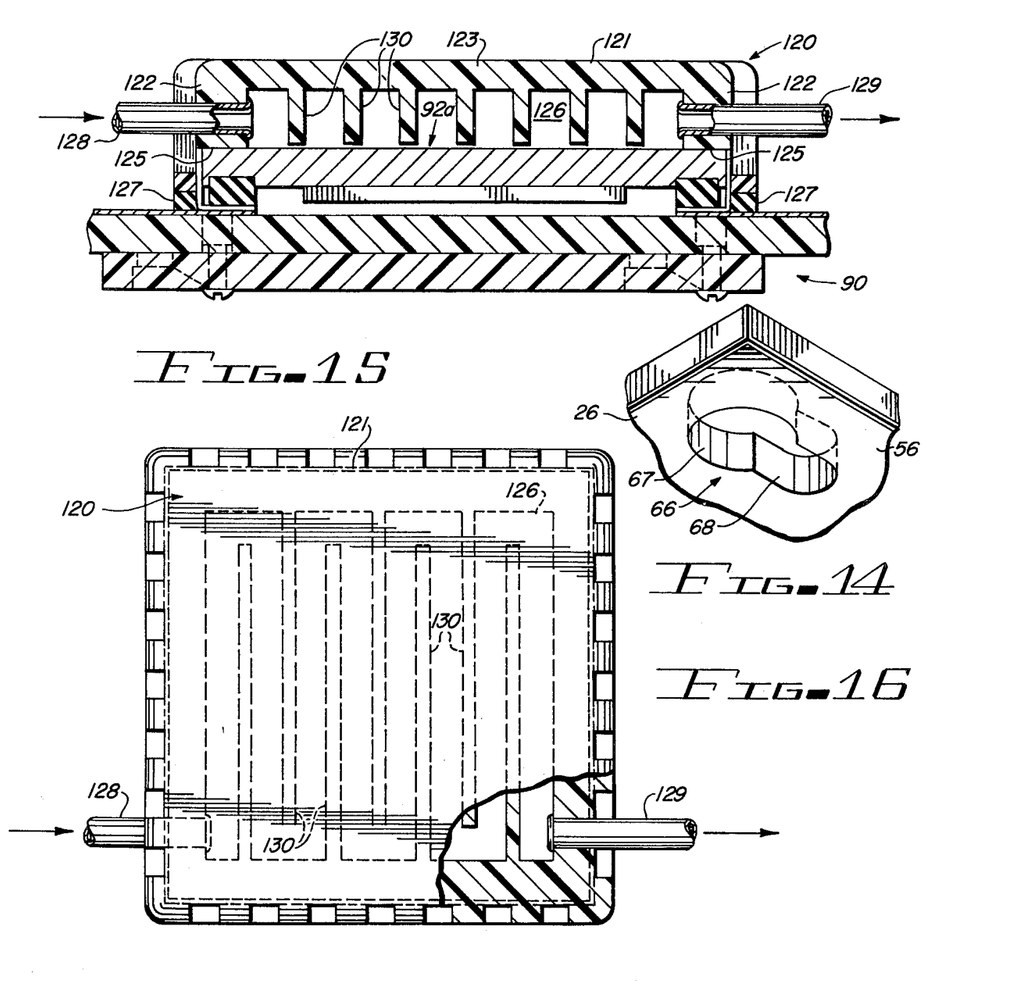
FIG. 14 is a view similar to FIGS. 12 and 13 and showing a third embodiment of a typical one of the special apertures formed in the mounting plate of the connectors of the present invention.
FIG. 15 is a sectional view similar to FIG. 6 and showing that embodiment of the connector of the present invention as including a cooling cover structure.
FIG. 16 is a plan view of the cooling cover shown in FIG. 15 with portions thereof broken away to show the various features.

Reference is now made to FIG. 14 wherein a typical one of a third form of aperture means 66 is shown. In this embodiment, the aperture means 66 includes only the keyhole aperture which passes completely through the mounting plate 26, and has an enlarged portion 67 and an extending narrowed slot 68. When the mounting plate 26 is configured with the aperture means 66, mounting thereof is accomplished by placing the mounting plate 26 in contiguous engagement with the bottom surface of the backpanel 28, with the stud means 42 entering into the enlarged portions 67 of their respectively aligned ones of the aperture means 66. The carrier member 22 is then pressed toward the surface of the backpanel 28, such as by hand, to compress the spring contact portions 37 of the edge contacts 36 of the carrier member 22, which causes the heads of the studs 42 to be disposed below the lower surface 56 of the mounting plate 26. Then the mounting plate 26 is laterally moved, as hereinbefore described, so that the narrowed slots 68 will move into a position where they straddle the shanks of their respective studs 42. When this lateral movement of the mounting plate is completed, the carrier member 22 is released and the resilient spring contact portions 37 of the edge contacts will move the carrier member 22 away from the backpanel 28 and thus bring the shoulders of the studs 42 into locked bearing engagement with the lower surface of the mounting plate.

Figures 4, 5:
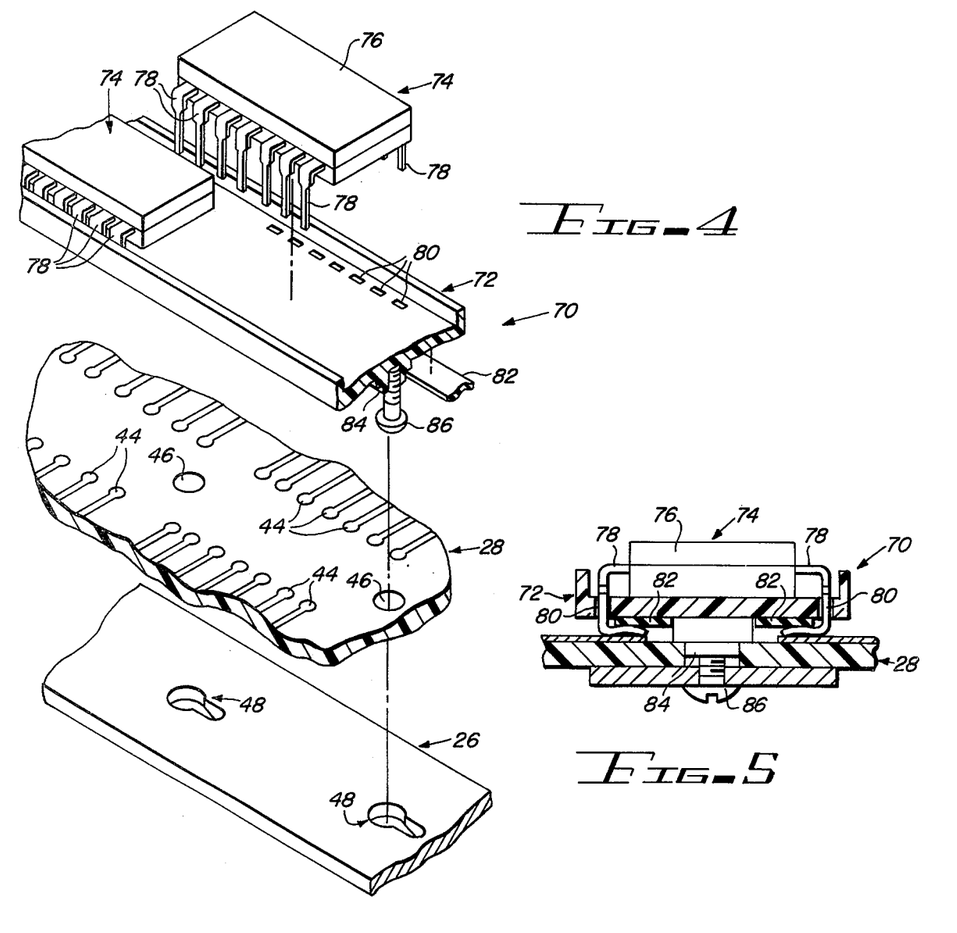
FIG. 4 is a fragmentary exploded isometric view of a second configuration of the connector of the preferred embodiment of the present invention and showing the various features thereof.
FIG. 5 is an enlarged fragmentary transverse sectional view of the connector shown in FIG. 4.

Referring now to FIGS. 4 and 5 which show a modification of the preferred embodiment of the connector of the present invention, with this modified connector being indicated generally by the reference numeral 70.

The connector 70, as will hereinafter be described in detail, includes a carrier member 72 having a plurality of dual-in-line integrated circuit packages 74 mounted thereon, and the mounting plate 26 which cooperates with the carrier member 72 to mount and electrically couple the circuit packages 74 to the backpanel 28.

The integrated circuit package 74 is a well known structure which is often referred to as a dual-in-line package (DIP) and includes a rectangular planar substrate 76 in which discrete integrated circuit chips (not shown) are sealingly mounted. A plurality of leads 78 extend laterally from each of the opposite longitudinal sides of the substrate 76 and are bent along their length so as to depend therefrom.

The carrier member 72 of the connector 70 is a planar structure formed of electrically insulative material and has a row of apertures 80 formed therethrough and disposed adjacent each of the opposite longitudinal edges thereof. The apertures 80 are disposed and arranged to match the pattern of the depending leads 78 of the DIP package 74 so that when the package is placed atop the carrier member 72, the leads 78 will each enter into a different aligned one of the apertures 80. The carrier member 72 may be configured so as to supportingly carry a single one of the DIP packages 74, however, it is preferred that the carrier member 72 be an elongated strip-like structure as shown to carry a plurality of such packages.

In either case, the leads 78 of the DIP package 74 extend through their respectively aligned ones of the apertures 80 of the carrier member 72 and are bent over as shown in FIG. 5 so that the lowermost ends of the leads 78 will extend toward the center of the carrier member 72. By bending the leads 78 as described above, the DIP package 74 will be lockingly held on the carrier member 72 and the lowermost ends of the leads will serve as electrical terminals or contacts for the DIP package 74. Elongated strips 82 of elastomeric material are interposed between the bent over leads 78 of the DIP package 74 and the bottom planar surface of the carrier member 72 to provide resiliency for the leads 78 to augment the pressurized electrical connection thereof as will be explained.

The carrier member 72 is provided with depending bosses 84 having stud means 86 extending coaxially therefrom, with it being seen that the bosses 84 are identical to the previously discussed bosses 38 and the stud means 86 are identical to the previously described stud means 42.

Further it will be noted that the backpanel 28 and the mounting plate 26 are the same as those discussed in detail with regard to the connector 20.

As was the case with the connector 20, mounting of the connector 70 is accomplished by placing the carrier member 72 on one of the planar surfaces of the backpanel 28 so that the contact portions of the leads 78 of the DIP package 74 are aligned with the terminal pads 44 of the backpanel 28, and the bosses 84 and studs 86 enter into the holes 46 thereof. The mounting plate 26 is then placed in contiguous engagement with the opposite planar surface of the backpanel 28 with the stud means 86 positioned in the aperture means 48 thereof. Lateral sliding movement of the mounting plate 26 will pull the carrier member 72 toward the backpanel 28 and will, in the manner previously described, pressurize the contacts 78 of the DIP package 74 into conductive contact with the terminal pads 44 of the backpanel 28.

Referring now to FIGS. 6 through 11 wherein another embodiment of the connector of the present invention is shown, with this connector being indicated generally by the reference numeral 90.

Figure 6:
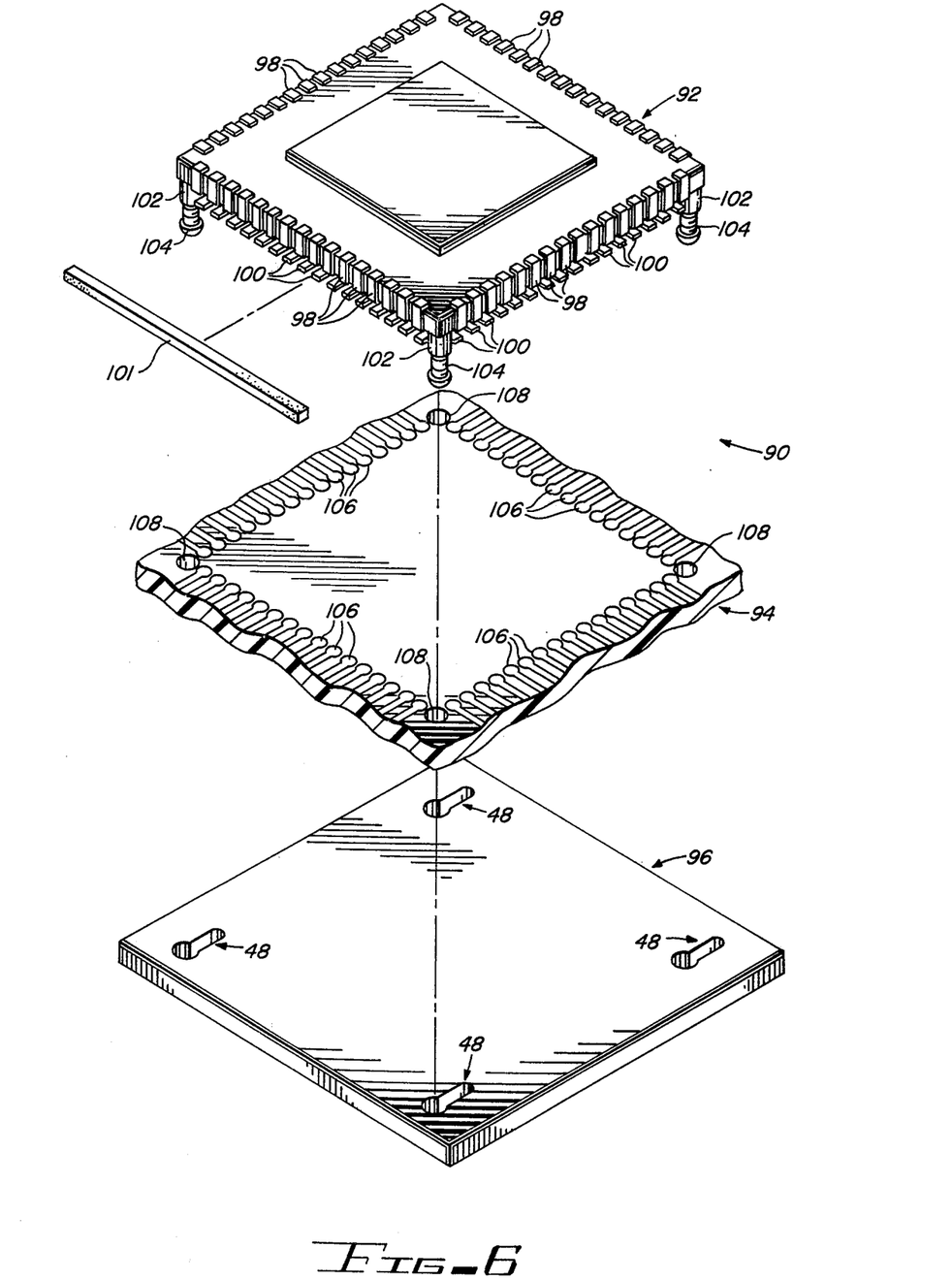
FIG. 6 is an exploded isometric view of a second embodiment of the connector of the present invention and illustrating the various features thereof.
Figures 7, 8, 9:
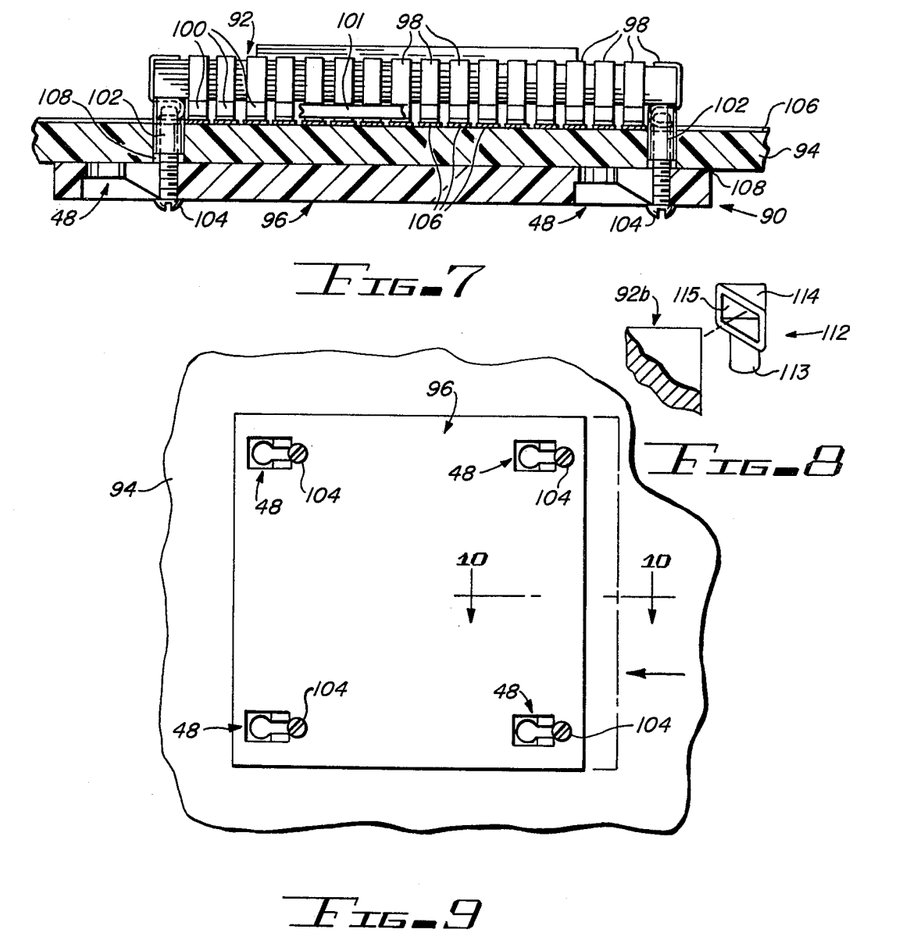
FIG. 7 is an enlarged sectional view of the connector illustrated in FIG. 6.
FIG. 8 is a fragmentary exploded isometric view illustrating a structural modification of the connector shown in FIGS. 6 and 7.
FIG. 9 is a bottom view of the connector shown in FIGS. 6 and 7.
Figure 10:
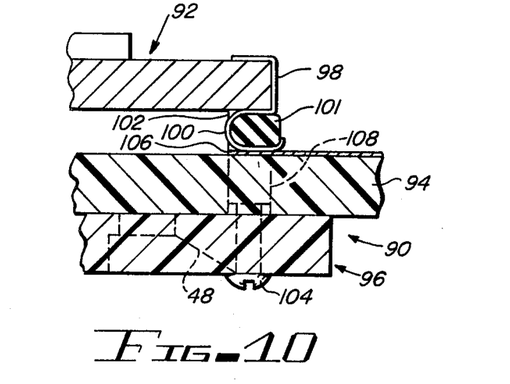
FIG. 10 is an enlarged fragmentary sectional view taken on the line 10—10 of FIG. 9.

In this embodiment, the connector 90 includes a modified version of one of the previously described JEDEC packages, with the modified package being indicated in its entirety by the reference numeral 92. As will be explained, the integrated circuit package 92 is pulled into pressurized electrical contact with a backpanel 94 by means of a mounting plate 96.

The integrated circuit package 92 is of square planar configuration and has a plurality of edge contacts 98 on each of its peripheral edges. The edge contacts 98 wrap around the edges of the package and are provided with spring contact portions 100 which dependingly extend therefrom and elongated strips 101 of elastomeric material are interposed in the loops of the spring contact portions 100 for maintaining alignment and providing support therefor. The package 92 is provided with a depending boss 102 at each of its corners and each of the bosses has a headed stud means 104 extending axially therefrom.

The backpanel 94 is a printed circuit board having its terminal pads 106 arranged thereon to correspond with the array of edge contacts 98 of the integrated circuit package 92, and is provided with holes 108 formed therethrough. The holes 108 are positioned in the backpanel 94 to correspond with the depending bosses 102 of the circuit package 92 so that when the package is placed on the planar surface of the backpanel 94, the bosses 102 and stud means 104 will enter into the aligned holes 108 of the backpanel 94, and the spring contact portions 100 of the circuit package 92 will align with the terminal pads 106.

Although the bosses 102 of the circuit package 92 are shown as being of cylindrical configuration, it will be apparent that one of those bosses, and of course, its particular one of the holes formed through the backpanel, may be of a different configuration, such as square, to insure proper positioning of the package on the backpanel.

The mounting plate 96 is a planar structure which is ideally of the same geometric configuration as the integrated circuit package 92, i.e., square, and is provided with one of the aperture means 48 in each of its corners as shown in FIG. 9. Thus, placing the integrated circuit package 92 on the backpanel 94, as described above, and placing the mounting plate 96 in contiguous engagement with the opposite surface of the backpanel, will position each of the stud means 104 within a different aligned one of the aperture means 48. Lateral sliding movement of the mounting plate 96 from the dashed line position shown in FIG. 9 to the solid line position shown in the same Figure, will cause an interaction between the stud means 104 and the aperture means 48 in the manner hereinbefore described. This interaction will exert a pulling force on the integrated circuit package itself and will load the spring contact portions 100 of the package 92 into pressurized conductive contact with the terminal pads 106 of the backpanel 94 as shown best in FIG. 10.

Figure 11:
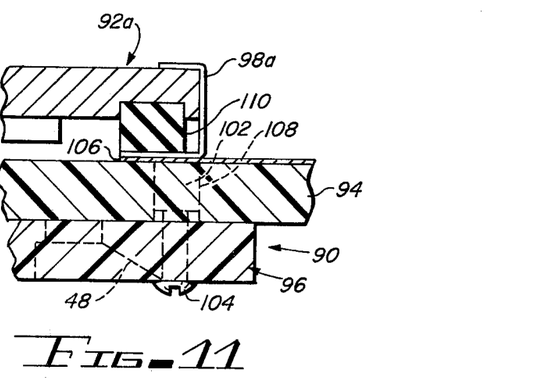
FIG. 11 is a view similar to FIG. 10 and illustrating an alternate form of the connector shown in FIGS. 6 and 7.

As seen in FIG. 11, a modified version of the integrated circuit package 92a may be mounted and electrically coupled to the backpanel 94 in exactly the same manner as the above described circuit package 92. In this modified version of the circuit package 92a, the edge contacts 98a each extend downwardly from the package and are bent along their length so as to wrap around an elastomeric member 110, which, due to the square configuration of the package 92a is in the form of a square ring-shaped structure. The elastomeric ring 110 of the circuit package 92a serves the same purpose as the hereinbefore described spring contact portions 100 of the integrated circuit package 92, in that the elastomeric ring 110 provides the necessary resiliency to enhance and insure the integrity of the pressurized conductive contact between the edge contacts 98a and the terminal pads 106.

The depending bosses 102 of the integrated circuit packages 92, or 92a, may be molded or otherwise integrally formed on the package during fabrication thereof. Alternatively, the bosses may be assembled to the circuit package subsequent to fabrication by cap-boss structures 112 as shown in FIG. 8. In this modified embodiment, the bosses 113 integrally depend from a corner cap structure 114 which is configured with an opening 115 for receiving a corner of the integrated circuit package 92b. The corner cap 114 is configured to engage both the top and bottom planar surfaces of the circuit package as well as the converging side edges thereof. In this manner, each of the corners of the circuit package 92b are nestingly received in different corner caps 114 of four cap-boss structures 112. The cap-boss structures 112 may be attached to the circuit package 92b in any suitable manner, such as an interference fit, welding, soldering, or may simply be positioned thereon in a non-attached manner.

Referring now to FIGS. 15 and 16, wherein the hereinbefore described integrated circuit package 92a, and connector 90, is shown as including a cooling cover which is indicated in its entirety by the reference numeral 120. The cooling cover 120 includes a planar body structure 121 having an endless sidewall 122 depending from a roof 123. The endless sidewall 122 and the roof 123 define a downwardly opening chamber into which the integrated circuit package 92a is nestingly positioned. As seen in FIG. 15, the inwardly facing surface of the endless sidewall 122 is formed with an endless ledge 125 which is in contiguous engagement with the top planar surface of the circuit package 92a so as to engage the package adjacent its peripheral edges. The circuit package 92a is affixed within the cooling cover by a suitable adhesive (not shown) so that the ledge 125 is in sealed liquid tight engagement with the circuit package. In this manner, a liquid tight chamber 126 is provided in the uppermost portion of the cooling cover 120 immediately above the exposed upper planar surface of the integrated circuit package 92a. The depending edge of the endless sidewall 122 of the planar body structure 121 may have an elastomeric sealing ring 127 attached thereto.

A liquid inlet pipe 128 and a liquid outlet pipe 129 are mounted on opposite sides of the cooling cover 120 and both are in communication with the liquid tight chamber 126 of the cover. A liquid coolant (not shown) such as water, an inert refrigerant or the like is supplied under pressure through the inlet pipe 128 into the liquid tight chamber 126 and that coolant will flow over the upper planar surface of the integrated circuit package 92a and will exit the chamber 126 through the outlet pipe 129. The coolant, which absorbs the heat produced by operation of the circuit package 92a, may then be directed through a suitable remotely located heat-exchanger (not shown) and then recirculated.

To insure efficient heat transfer between the integrated circuit package 92a and the coolant which is passable through the cooling cover 120, flow directing means are provided in the liquid tight compartment 126 so that the coolant will follow a tortuous path in its flow from the inlet pipe 128 to the outlet pipe 129. The flow directing means can be a separate element (not shown) however, for simplicity and convenience of assembly, it is preferred that it be molded or otherwise formed as an integral part of the cover assembly 120. Therefore, the preferred form of the flow directing means includes an especially configured array of walls or partitions 130 which depend normally from the roof 123 of the body structure 121 so that they extend into the liquid tight chamber 126. The partitions 130 can be arranged in various arrays so as to form a back and forth tortuous path for the coolant as shown in FIG. 16, or could alternately be arranged to form a spiral path (not shown) leading to a centrally located outlet pipe (not shown).

Figure 17:
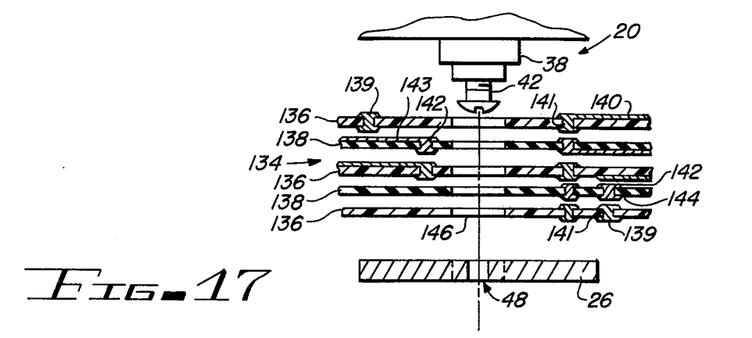
FIG. 17 is an orthographic exploded view illustrating the connectors of the present invention as being employed to assemble a multilayer printed circuit board.

It will be apparent from the foregoing that each of the hereinbefore described connectors 20, 70 and 90 apply a compressive force on the backpanel upon which they are mounted. Therefore, as shown in FIG. 17, that compressive force can be employed for assembling an especially configured multilayer backpanel which is indicated generally by the reference numeral 134. The multilayer backpanel 134 includes alternating layers of rigid substrates 136 and resilient elastomeric substrates 138 which are squeezed into contiguous conductive contact with each other to form a laminated structure. The rigid substrates 136 are conventional printed circuit structures formed of, for example, Fiberglas and having the usual metallic terminal pads 139, metallic conductive runs 140, and metallic conductive through holes or vias 141 printed or otherwise formed on each of the opposite planar surfaces thereof. The elastomeric substrates 136 are formed of any suitable resilient material such as silicone rubber, and have metallic terminal pads 142, metallic conductive runs 143, and metallic conductive through holes 144 bonded or otherwise affixed to its opposite surfaces.

Although the connector 20 is shown in FIG. 17 as being employed to assemble the special multilayer backpanel 134, it will be understood that any of the connectors 20, 70 and 90, or combinations thereof, can be employed for exerting the compressive force on the backpanel.

The multilayer backpanel 134 is provided with a plurality of holes 146 (not shown), each of which is formed by aligned holes formed through the stacked substrates 136 and 138, with the holes 146 being located at various locations on the backpanel 134. Each of the holes 146 are adapted to receive the depending bosses 38 of the carrier member or members 22, with the stud means 42 extending through the holes 146 into engagement with the aperture means 48 of the mounting plates 26.

While the principles of the invention have now been made clear in an illustrated embodiment, there will be immediately obvious to those skilled in the art, many modifications of structure, arrangements, proportions, the elements, materials, and components used in the practice of the invention, and otherwise, which are particularly adapted for specific environments and operation requirements without departing from those principles. The appended claims are therefore intended to cover and embrace any such modifications within the limits only of the true spirit and scope of the invention.

What I claim is:

1. A connector for removably mounting an integrated circuit package on a backpanel having at least one hole formed therethrough and for electrically coupling the integrated circuit package to the terminal pads of the backpanel, said connector comprising:
   (a) a carrier member of planar configuration for positioning adjacent one of the planar surfaces of the backpanel and movable toward the backpanel, said carrier member having at least one boss extending normally from one planar surface thereof for slidable positioning in the hole formed in the backpanel when said carrier member is positioned adjacent thereto;
   (b) at least one integrated circuit package mounted on the other planar surface of said carrier member and having electrical contact means thereon;
   (c) electrical interconnecting means on said carrier member in conductive contact with the electrical contact means of said integrated circuit package and for pressurized conductive contact with the terminal pads of the backpanel when said carrier member is positioned adjacent thereto;
   (d) stud means extending axially from the boss of said carrier member so as to extend through the hole of the backpanel when said carrier member is positioned adjacent thereto; and
   (e) a mounting plate positionable in contiguous contact with the opposite planar surface of the backpanel and laterally movable relative thereto, said mounting plate having at least one aperture means formed therethrough for receiving said stud means when said carrier member and said mounting plate are positioned adjacent the opposite planar surfaces of the backpanel, said stud means interacting with the aperture means of said mounting plate upon lateral movement thereof to pull said carrier member toward the backpanel to provide the pressurized conductive contact between said electrical interconnecting means and the terminal pads of the backpanel.

2. A connector as claimed in claim 1 wherein said electrical interconnecting means comprises:
   (a) a plurality of terminal pads arranged on the other planar surface of said carrier member in an array which matches the arrangement of the electrical contact means of said integrated circuit package;
   (b) a plurality of conductive runs each leading from a different one of said terminal pads to the edges of said carrier member; and
   (c) a plurality of edge contacts mounted on the edges of said carrier member, each of said edge contacts in conductive contact with a different one of said conductive runs and each having a spring contact portion which extends beyond the one planar surface of said carrier member.

3. A connector as claimed in claim 1 wherein the aperture means formed in said mounting plate comprises:
   (a) a lower surface formed on said mounting plate;
   (b) an upper surface formed on said mounting plate and laterally spaced from said lower surface;
   (c) an inclined plane surface extending angularly between said lower surface and said upper surface; and
   (d) said mounting plate having a keyhold shaped aperture formed therethrough, said aperture having an enlarged portion which opens downwardly onto said upper surface and having a narrowed slot which opens downwardly onto said inclined plane surface and onto said lower surface.

4. A connector as claimed in claim 1 wherein the aperture means formed in said mounting plate comprises:
   (a) an upper surface forming the top of a recessed cavity provided in the lower planar surface of said mounting plate;
   (b) an inclined plane surface formed in said mounting plate so as to extend laterally angularly and downwardly from said upper surface to the lower planar surface of said mounting plate; and
   (c) said mounting plate having a keyhole shaped aperture formed therethrough, said aperture having an enlarged portion which opens downwardly onto said upper surface and having a narrowed slot which opens downwardly onto said inclined plane surface and onto the lower planar surface of said mounting plate.

5. A connector as claimed in claim 1 wherein the aperture means formed in said mounting plate comprises:
   (a) a depending pedestal formed on said mounting plate and having a lower surface;
   (b) an inclined plane surface extending laterally angularly and upwardly from the lower surface of said pedestal to the lower planar surface of said mounting plate; and
   (c) said mounting plate having a keyhole shaped aperture formed therethrough, said aperture having an enlarged portion which opens downwardly onto the lower planar surface of said mounting plate adjacent said inclined plane surface and having a narrowed slot which opens downwardly onto said inclined plane surface and onto the lower surface of said pedestal.

6. A connector as claimed in claim 1 wherein said stud means comprises:
   (a) a shank portion extending axially from the boss of said carrier member; and
   (b) an enlarged head on the extending end of said shank.

7. A connector as claimed in claim 1 and further comprising:
   (a) said stud means including,
      I. a shank portion extending axially from the boss of said carrier member,
      II. an enlarged head on the extending end of said shank; and (b) said aperture means formed in said mounting plate being of keyhole shaped configuration and extending between the opposite planar surfaces thereof, said keyhole shaped aperture having an enlarged portion for receiving said enlarged head of said stud means and having a narrowed slot which straddles said shank when said mounting plate is positioned in contiguous engagement with the opposite planar surface of the backpanel and moved laterally thereon.

8. A connector as claimed in claim 1 and further comprising:
   (a) said carrier member being of elongated rectangular configuration and having a plurality of the bosses extending normally therefrom;
   (b) a plurality of said integrated circuit packages mounted on the other planar surface of said carrier member in side-by-side positions along the length thereof; and
   (c) a plurality of said stud means each extending axially from a different one of the plurality of bosses of said carrier member.

9. A connector for removably mounting an integrated circuit package on a backpanel having at least one hole formed therethrough and for electrically connecting the integrated circuit package to the terminal pads of the backpanel, said connector comprising:
   (a) a carrier member of planar configuration for positioning adjacent one of the planar surfaces of the backpanel and movable toward the backpanel, said carrier member having at least one boss extending normally from one planar surface thereof for slidable positioning in the hole formed in the backpanel when said carrier member is positioned adjacent thereto;
   (b) at least one integrated circuit package positioned on the opposite planar surface of said carrier member and having leads extending from at least two of the opposed sides of a planar substrate;
   (c) means formed in said carrier member for receiving the leads of said integrated circuit package and allowing those leads to be positioned so that the extending ends thereof are disposed to lay on the one planar surface of said carrier member;
   (d) stud means extending axially from the boss of said carrier member so as to extend through the hole of the backpanel when said carrier is positioned adjacent thereto; and
   (e) a mounting plate positionable in contiguous contact with the opposite planar surface of the backpanel and laterally movable relative thereto, said mounting plate having at least one aperture means formed therethrough for receiving said stud means when said carrier member and said mounting plate are positioned adjacent the opposite planar surfaces of the backpanel, said stud means interacting with the aperture means upon lateral movement of said mounting plate to pull said carrier member toward the backpanel and move the extending ends of the leads of the integrated circuit package into pressurized conductive contact with the terminal pads of the backpanel.

10. A connector as claimed in claim 9 and further comprising a layer of resilient elastomeric material interposed between the one planar surface of said carrier member and the extending ends of the leads of said integrated circuit package.

11. A connector as claimed in claim 9 wherein the aperture means formed in said mounting plate comprises:
   (a) a lower surface formed on said mounting plate;
   (b) an upper surface formed on said mounting plate and laterally spaced from said lower surface;
   (c) an inclined plane surface extending angularly between said lower surface and said upper surface; and
   (d) said mounting plate having a keyhole shaped aperture formed therethrough, said aperture having an enlarged portion which opens downwardly onto said upper surface and having a narrowed slot which opens downwardly onto said inclined plane surface and onto said lower surface.

12. A connector as claimed in claim 9 wherein said stud means comprises:
   (a) a shank extending axially from said boss of said carrier member; and
   (b) an enlarged head on the extending end of said shank.

13. A connector as claimed in caim 9 and further comprising:
   (a) said stud means including,
      I. a shank portion extending axially from the boss of said carrier member,
      II. an enlarged head on the extending end of said shank; and
   (b) said aperture means formed in said mounting plate being of keyhole shaped configuration and extending between the opposite planar surfaces thereof, said keyhole shaped aperture having an enlarged portion for receiving said enlarged head of said stud means and having a narrowed slot which straddles said shank when said mounting plate is positioned in contiguous engagement with the opposite planar surface of the backpanel and moved laterally thereon.

14. A connector as claimed in claim 9 and further comprising:
   (a) said carrier member being of elongated rectangular configuration and having a plurality of the bosses extending therefrom;
   (b) a plurality of said integrated circuit packages mounted on the opposite planar surface of said carrier member in a side-by-side relationship along the length thereof; and
   (c) a plurality of said stud means each extending axially from a different one of the plurality of bosses of said carrier member.

15. A combination of an integrated circuit package and connector for removably mounting the integrated circuit package on a backpanel having at least one hole formed therethrough and for electrically connecting the integrated circuit package to the terminal pads of the backpanel, said combination comprising:
   (a) an integrated circuit package for positioning adjacent one of the planar surfaces of the backpanel and movable toward the backpanel, said circuit package moving electrical contact means thereon and having at least one boss extending therefrom for slidable positioning in the hole of the backpanel when said circuit package is positioned adjacent thereto;
   (b) stud means extending coaxially from the boss of said circuit package so as to extend through the hole of the backpanel when said circuit package is positioned adjacent the one surface of the backpanel; and (c) a mounting plate positionable in contiguous engagement with the opposite planar surface of the backpanel and laterally movable thereon, said mounting plate having at least one aperture means formed therethrough for receiving said stud means when said circuit package and said mounting plate are positioned adjacent the opposite surfaces of the backpanel, said stud means interacting with the aperture means of said mounting plate upon lateral movement thereof to pull said circuit package toward the backpanel and move the electrical contact means of said circuit package into pressurized conductive contact with the terminal pads of the backpanel.

16. The combination of claim 15 wherein the aperture means formed in said mounting plate comprises:
(a) a lower surface formed on said mounting plate;
(b) an upper surface formed on said mounting plate and laterally spaced from said lower surface;
(c) an inclined plane surface extending angularly between said lower surface and said upper surface; and
(d) said mounting plate having a keyhole shaped aperture formed therethrough, said aperture having an enlarged portion which opens downwardly onto said upper surface and having a narrowed slot which opens downwardly onto said inclined plane surface and onto said lower surface.

17. The combination of claim 15 wherein said stud means comprises:
(a) a shank portion extending axially from the boss of said integrated circuit package; and
(b) an enlarged head on the extending end of said shank.

18. The combination of claim 15 and further comprising:
(a) said stud means including,
  I. a shank portion extending axially from the boss of said integrated circuit package,
  II. an enlarged head on the extending end of said shank; and
(b) said aperture means formed in said mounting plate being of keyhole shaped configuration and extending between the opposite planar surfaces thereof, said keyhole shaped aperture having an enlarged portion for receiving said enlarged head of said stud means and having a narrowed slot which straddles said shank when said mounting plate is positioned in contiguous engagement with the opposite planar surface of the backpanel and moved laterally thereon.

19. The combination of claim 15 and further comprising:
(a) said integrated circuit package being of square planar configuration and have four of the bosses with each of those bosses extending from a different corner of said integrated circuit package; and
(b) four of said stud means each extending axially from a different one of the four of said bosses of said circuit package.

20. The combination of claim 15 and further comprising:
(a) a cooling cover having a downwardly opening chamber formed therein;
(b) said integrated circuit package sealingly mounted in the chamber of said cooling cover with the top of said circuit package spaced below the upper portion of the chamber to form a liquid tight compartment immediately above said circuit package; and
(c) means in said cooling cover through which a liquid coolant is circulatingly suppliable to the liquid tight compartment formed by said cooling cover and said circuit package.

21. The combination of claim 20 and further comprising flow directing means in said liquid tight compartment formed by said cooling cover and said integrated circuit package, said flow directing means forming a tortuous path of flow for the liquid coolant when that coolant is circulatingly supplied thereto.

22. The combination of a connector for mounting an integrated circuit package on a multilayer backpanel and electrically coupling the integrated circuit package thereto and for exerting a compressive force on the backpanel for electrically interconnecting the multiple layers thereof, said combination comprising:
(a) a multilayer backpanel having alternating rigid substrates and resilient elastomeric substrates each of which is provided with a conductive circuit having terminal pads, said backpanel having at least one hole aligningly formed through the multiple layers thereof;
(b) a carrier member having at least one integrated circuit package mounted thereon and positioned adjacent one of the exposed surfaces of said backpanel and movable toward that surface, said carrier member having at least one boss extending therefrom into the hole of said backpanel;
(c) stud means extending axially from the boss of said carrier member through the hole of said backpanel; and
(d) a mounting plate in contiguous engagement with the opposite exposed surface of said backpanel and laterally movable thereon, said mounting plate having at least one aperture means formed therethrough for receiving said stud means, the aperture means interacting with said stud means upon lateral movement of said mounting plate to pull said carrier member toward said backpanel to provide pressurized conductive contact between the electrical contacts of the integrated circuit package and the exposed terminal pads of said backpanel and to exert a compressive force on said backpanel to provide pressurized conductive contact between the internal terminal pads of the multiple layers of said backpanel.

23. The combination of a connector for mounting an integrated circuit package on a multilayer backpanel and electrically coupling the integrated circuit package thereto and for exerting a compressive force on the backpanel for electrically interconnecting the multiple layers thereof, said combination comprising:
(a) a multilayer packpanel having alternating rigid substrates and resilient elastomeric substrates each of which is provided with a conductive circuit having terminal pads, said backpanel having at least one hole aligningly formed through the multiple layers thereof;
(b) an integrated circuit package positioned adjacent one of the exposed planar surfaces of said backpanel and movable toward that surface, said circuit package having electrical contact means thereon and having at least one boss extending therefrom into the hole of said backpanel;

(c) stud means extending axially from the boss of said circuit package through the hole of said backpanel; and
(d) a mounting plate in contiguous engagement with the opposite exposed surface of said backpanel and laterally movable thereon, said mounting plate having at least one aperture means formed therethrough for receiving said stud means, the aperture means interacting with said stud means upon lateral movement of said mounting plate to pull said circuit package toward said backpanel to provide pressurized conductive contact between the electrical contacts of said circuit package and the exposed terminal pads of said backpanel and to exert a compressive force on said backpanel to provide pressurized conductive contact between the internal terminal pads of the multiple layers of said backpanel.

* * * * *